(12) United States Patent
Yuzawa

(10) Patent No.: US 7,144,758 B2
(45) Date of Patent: Dec. 5, 2006

(54) MANUFACTURING METHOD OF SEMICONDUCTOR DEVICE, INCLUDING DIFFERENTLY SPACED BUMP ELECTRODE ARRAYS

(75) Inventor: Hideki Yuzawa, Iida (JP)

(73) Assignee: Seiko Epson Corporation (JP)

( * ) Notice: Subject to any disclaimer, the term of this patent is extended or adjusted under 35 U.S.C. 154(b) by 42 days.

(21) Appl. No.: 10/850,835

(22) Filed: May 19, 2004

(65) Prior Publication Data

US 2005/0009240 A1    Jan. 13, 2005

(30) Foreign Application Priority Data

May 20, 2003    (JP)    ............... 2003-142323

(51) Int. Cl.
H01L 21/44    (2006.01)
H01L 21/48    (2006.01)
H01L 21/50    (2006.01)

(52) U.S. Cl. ............... 438/108; 438/118; 174/250; 174/261; 257/E21.503; 257/E23.065; 257/E23.07

(58) Field of Classification Search ............... 438/108, 438/118; 174/250, 261
See application file for complete search history.

(56) References Cited

U.S. PATENT DOCUMENTS 6,437,253 B1    8/2002    Saito et al.

6,867,490 B1 *    3/2005    Toyosawa ............... 257/692

FOREIGN PATENT DOCUMENTS

| JP | 2000-049193 | 2/2000 |
|---|---|---|
| JP | 2000-269611 | 9/2000 |
| JP | 3431406 | 5/2003 |
| JP | 2004-221319 | 8/2004 |
| JP | 2004-221320 | 8/2004 |

OTHER PUBLICATIONS

Communication from Japanese Patent Office re: related application, no date.

* cited by examiner

Primary Examiner—Fernando L. Toledo
(74) Attorney, Agent, or Firm—Harness, Dickey & Pierce, P.L.C.

(57) ABSTRACT

First bump electrodes are arrayed in a straight line along a first side of a semiconductor chip. Second bump electrodes are more narrowly arrayed in a zigzag arrangement along a second side of the chip. By carrying out an injection of a sealing resin from the second side on which the second bump electrodes are arrayed, a surface of the semiconductor chip that is subjected to face-down mounting on a film substrate is sealed.

2 Claims, 4 Drawing Sheets

MANUFACTURING METHOD OF SEMICONDUCTOR DEVICE, INCLUDING DIFFERENTLY SPACED BUMP ELECTRODE ARRAYS

RELATED APPLICATIONS

This application claims priority to Japanese Patent Application No. 2003-142323 filed May 20, 2003 which is hereby expressly incorporated by reference herein in its entirety.

BACKGROUND

1. Field of the Invention

The present invention relates to a manufacturing method of a semiconductor device and a manufacturing method of an electronic device, especially adequate for resin sealing processes such as COF (Chip On Film).

2. Description of the Related Art

As for a conventional semiconductor device, for example, as disclosed in Japanese Unexamined Patent Application Publication No. 2000-269611, a method that a semiconductor is flip-chip mounted on a film substrate by bonding of a bump electrode on a connecting terminal formed on the film substrate is introduced. As for a method to seal the semiconductor chip that is flip-chip mounted, a sealing resin is injected into the interstices between the semiconductor chip and the film substrate.

Along with a miniaturization of circuit patterns, since the bump electrode is- arrayed in a fine pitch, a void occurs in the sealing resin injected into the interstices between the semiconductor chip and the film substrate which deteriorates a sealing performance of the semiconductor chip.

In view of this, the invention aims to provide a manufacturing method of a semiconductor device and an electronic device to enable resin injection to be carried out while suppressing a void from occurring.

SUMMARY

In order to solve the above-mentioned problem, a method for manufacturing a semiconductor device of an aspect of the invention includes a step of face-down mounting a semiconductor chip on a wiring board, the semiconductor chip having a plurality of differently spaced bump electrode arrays and a step of carrying out a resin injection from a bump electrode array side of the chip having the most narrow spacing.

Accordingly, it is possible to increase a resin injection pressure at the narrowest bump electrode array side by changing a resin injecting direction. Thus, this makes it possible to inject the resin into the interstices between the semiconductor chip and the wiring board while enabling the resin to spread around the bump electrodes even if the spacing of the bump electrode array is narrow. Consequently, this makes it possible to suppress an occurrence of a void in a sealing resin injected into the interstices between the semiconductor chip and the wiring board without increasing complex and laborious handling in manufacturing processes and also to improve a sealing performance of the semiconductor chip that is subjected to face-down mounting.

Also, a method for manufacturing a semiconductor device of an aspect of the invention includes a step of subjecting a semiconductor chip to face-down mounting on a wiring board, the semiconductor chip including first bump electrodes arrayed in a straight line and a second bump electrodes arrayed in a zigzag arrangement and a step of carrying out a resin injection from the second bump electrode side of the chip.

This makes it possible to suppress an occurrence of a void in a sealing resin injected into the interstices between the semiconductor chip and the wiring board by changing a resin injecting direction. As a result, it is possible to improve a sealing performance of the semiconductor chip that is subjected to face-down mounting while enabling a fine pitch to be applied to the bump electrodes.

Also, a method for manufacturing a semiconductor device of an aspect of the invention includes a step of face-down mounting a semiconductor chip on a wiring board, the semiconductor chip including a first bump electrode array formed at a signal input side and a second bump electrode array formed at a signal output side and a step of carrying out a resin injection from the second bump electrode array side.

Accordingly, even if the number of wirings of the signal output side is larger than that of the signal input side, this makes it possible to suppress an occurrence of a void in a sealing resin injected into the interstices between the semiconductor chip and the wiring board by changing a resin injecting direction. As a result, it is possible to improve a sealing performance of the semiconductor chip that is subjected to face-down mounting without increasing complex and laborious handling in manufacturing processes.

Also, a method for manufacturing a semiconductor device of an aspect of the invention includes a step of face-down mounting a semiconductor chip on a wiring board, the semiconductor chip including at least two sides along which a plurality of differently spaced bump electrode arrays are disposed and a step of carrying out a resin injection from a long side of the chip on which the bump electrode array having the most narrow spacing is disposed.

Accordingly, it is possible to increase a resin injection pressure at the narrowest bump electrode array side by changing a resin injecting direction while enabling a resin flowing channel to be shortened. As a result, it is possible to suppress an occurrence of a void in the sealing resin injected into the interstices between the semiconductor chip and the wiring board and also to improve a sealing performance of the semiconductor chip that is subjected to face-down mounting without increasing complex and laborious handling in manufacturing processes.

Also, a method for manufacturing an electronic device of an aspect of the invention includes a step of subjecting an electric component to flip-chip mounting on a wiring board, the electronic component including a plurality of differently spaced bump electrode arrays are disposed and a step of carrying out a resin injection from the bump electrode array side having the most narrow spacing.

Accordingly, it is possible to increase a resin injection pressure at the narrowest bump electrode array side by changing a resin injecting direction. Thus, this makes it possible to inject a resin into the interstices between the electronic component and the wiring board while enabling the resin to spread around the bump electrodes even if the spacing of the electrodes is narrow. Consequently, this makes it possible to suppress an occurrence of a void in a sealing resin injected into the interstices between the electronic component and the wiring board without increasing complex and laborious handling in manufacturing processes and also to improve a sealing performance of the electronic component that is subjected to flip-chip mounting.

Also, a method for manufacturing an electronic device of an aspect of the invention includes a step of subjecting an electronic component to face-down mounting on a wiring board, the electronic component including first bump electrodes arrayed in a straight line and second bump electrodes arrayed in a zigzag arrangement and a step of carrying out a resin injection from the second bump electrode side of the chip.

This makes it possible to suppress an occurrence of a void in a sealing resin injected into the interstices between the electronic component and the wiring board by changing a resin injecting direction. As a result, it is possible to improve a sealing performance of the electronic component that is subjected to flip-chip mounting while enabling a fine pitch to be applied to the bump electrodes.

Also, a method for manufacturing an electronic device of an aspect of the invention includes a step of flip-chip mounting an electronic component on a wiring board, the electronic component including a first bump electrode array formed at a signal input side and a second bump electrode array formed at a signal output side and a step of carrying out a resin injection from the second bump electrode array side.

Accordingly, even if the number of wirings of the signal output side is larger than that of the signal input side, this makes it possible to suppress an occurrence of a void in a sealing resin injected into the interstices between the electronic component and the wiring board by changing a resin injecting direction. As a result, it is possible to improve a sealing performance of the electronic component that is subjected to flip-chip mounting without increasing complex and laborious handling in manufacturing processes.

Also, a method for manufacturing an electronic device of an aspect of the invention includes a step of face-down mounting an electronic component on a wiring board, the electronic component including at least two sides along which a plurality of differently spaced bump electrode arrays are disposed and a step of carrying out a resin injection from a long side of the chip on which the bump electrode array having the most narrow spacing is disposed.

Accordingly, it is possible to increase a resin injection pressure at the most narrow bump electrode array side by changing a resin injecting direction while a resin flowing channel is shortened. As a result, it is possible to suppress an occurrence of a void in a sealing resin injected into the interstices between the electronic component and the wiring board and also to improve a sealing performance of the electronic component that is subjected to flip-chip mounting without increasing complex and laborious handling in manufacturing processes.

DETAILED DESCRIPTION

The manufacturing method of the semiconductor device according to the invention will now be described by referring to the accompanying drawings.

Figure 1A:
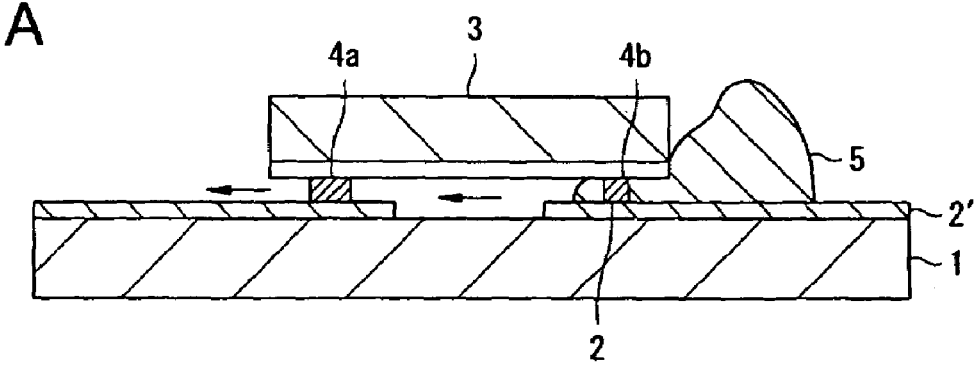
FIGS. 1(a) and (b) are sectional and plan views showing a method for manufacturing the semiconductor device of a first embodiment of the invention.
Figure 1B:
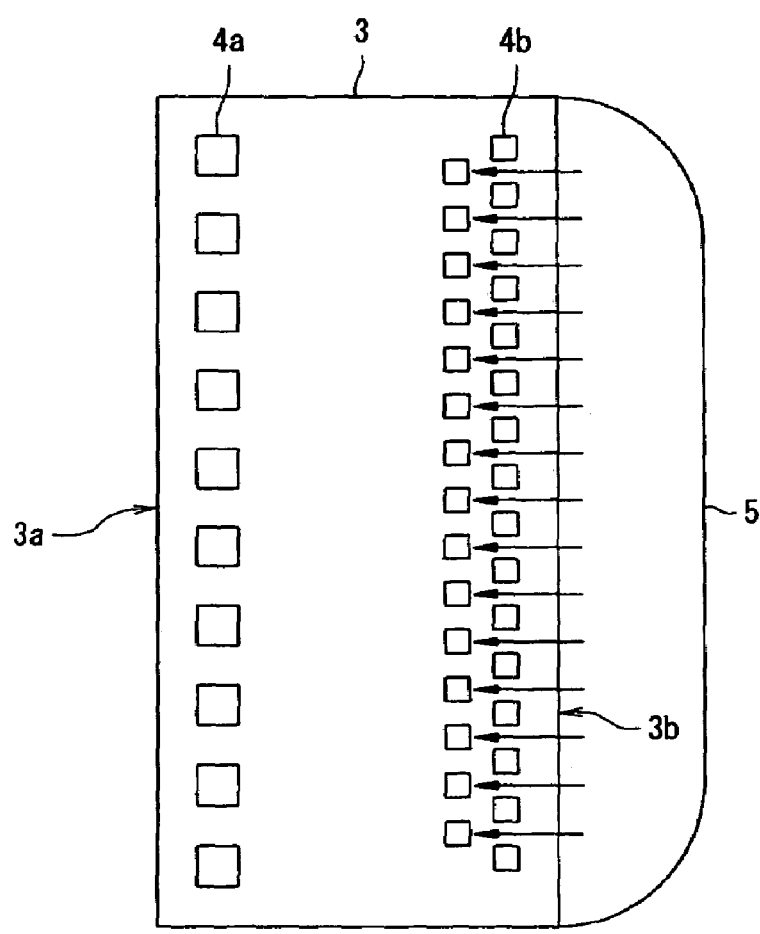

FIG. 1(a) is a sectional view showing a manufacturing method of a semiconductor device of a first embodiment of the invention. FIG. 1(b) is a plan view showing a flow of a sealing resin 5 on a semiconductor chip 3 shown in FIG. 1(a).

In FIG. 1, a connecting terminal 2 is connected to the wiring portion 2'. Bump electrodes 4a and 4b are disposed on the semiconductor chip 3. The bump electrodes 4a are arrayed in a straight line along one long side 3a of the semiconductor chip 3 and the bump electrodes 4b are arrayed in a zigzag arrangement along the other long side 3b of the semiconductor chip 3.

The semiconductor chip 3 is subjected to face-down mounting in which the bump electrodes 4a and 4b are connected onto the wiring terminal 2. A surface of the semiconductor chip 3 is sealed by injecting the sealing resin 5 into the interstices between the semiconductor chip 3 and the film substrate 1. Here, it is possible to carry out the injection of the sealing resin 5 from the long side 3b along which the bump electrodes 4b are arrayed to seal the surface of the semiconductor chip 3.

Accordingly, as compared with the bump electrode 4a side, the bump electrodes 4a are arrayed in a straight line, it is possible to increase an injection pressure of the sealing resin 5 at the bump electrode 4b side, the electrodes 4b being arrayed in a zigzag arrangement. Thus, this makes it possible to seal the surface of the semiconductor chip 3 while enabling the sealing resin 5 to spread around the bump electrodes 4b. Therefore, it is possible to suppress an occurrence of a void in the sealing resin 5 injected into the interstices between the semiconductor chip 3 and the film substrate 1. As a result, it is possible to improve a sealing performance of the semiconductor chip 3 that is subjected to face-down mounting while enabling a fine pitch to be applied to the bump electrodes 4b.

While a method with the semiconductor chip 3 mounted on the film substrate 1 was introduced in the above-mentioned embodiment, examples of members on which the semiconductor chip 3 is mounted include a printed wiring board, a multilayer board, a build up board, a tape substrate, a glass substrate and so forth, and are not necessarily limited to the film substrate 1.

Figure 2:
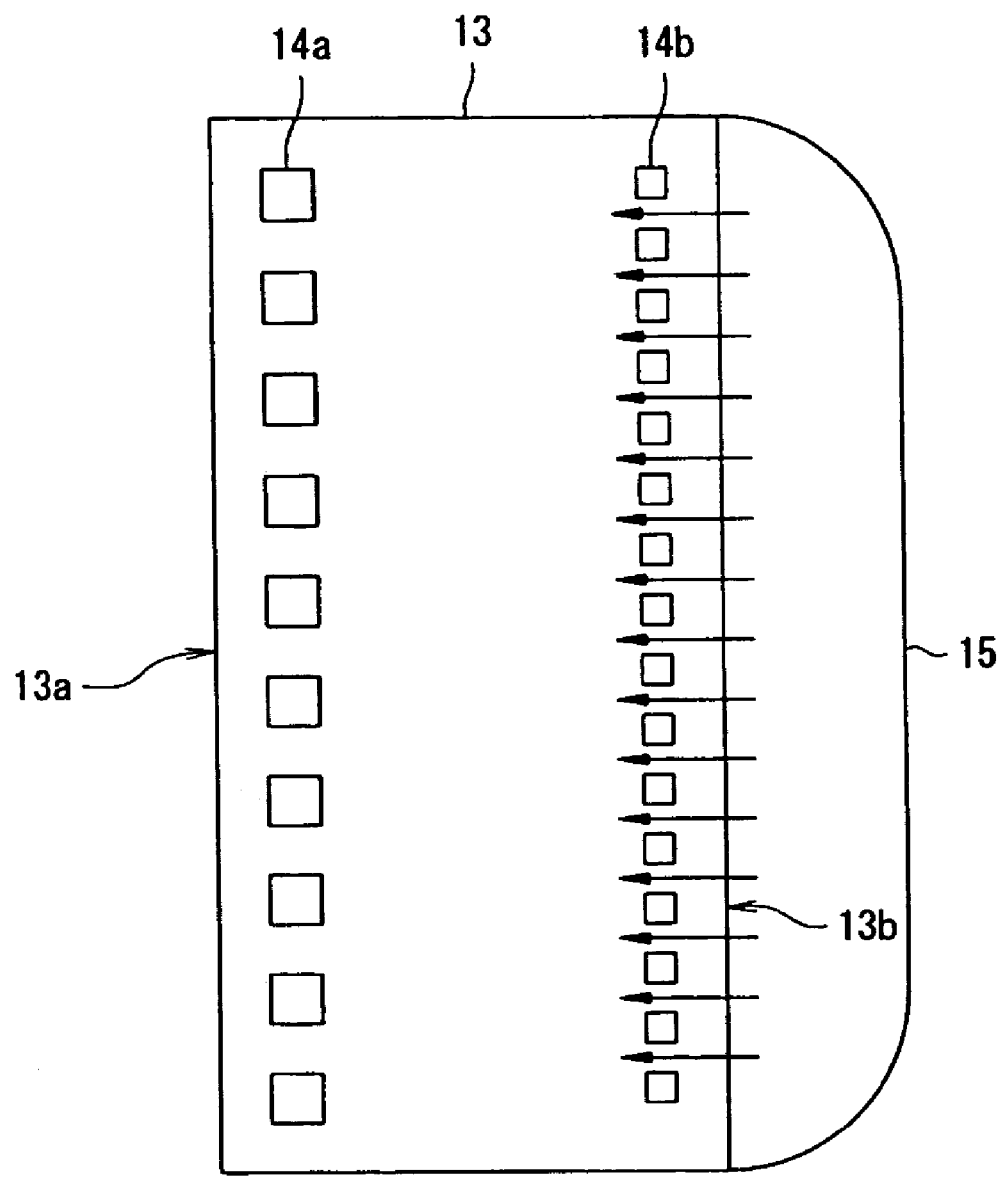
FIG. 2 is a plan view showing a method for manufacturing the semiconductor device of a second embodiment of the invention.

FIG. 2 is a plan view showing a flow of a sealing resin 15 on a semiconductor chip 13 of a second embodiment of the invention.

In FIG. 2, bump electrodes 14a and 14b are disposed on the semiconductor 13. Each bump electrode array 14a and 14b is respectively arranged in a straight line along a long side 13a or 13b opposing each other on the semiconductor chip 13. A spacing between the bump electrodes 14b in the array is narrower than that of the bump electrodes 14a. Here, it is possible to carry out the injection of the sealing resin 15 from the long side 13b along which the bump electrodes 14b are arrayed to seal the surface of the semiconductor chip 13 that is subjected to face-down mounting via the bump electrodes 14a and 14b.

Accordingly, it is possible to increase an injection pressure of the sealing resin 15 at the array side of the bump electrodes 14b having a more narrow spacing than that of the bump electrodes 14a by adjusting an injecting direction of the sealing resin 15. Thus, even in a narrow spacing case such as the bump electrodes 14b, it is possible to seal the surface of the semiconductor 13 while suppressing the occurrence of a void in the sealing resin 15. As a result, it is possible to improve the sealing performance of the semiconductor chip 13 that is subjected to face-down mounting without increasing complex and laborious handling in manufacturing processes.

Figure 3:
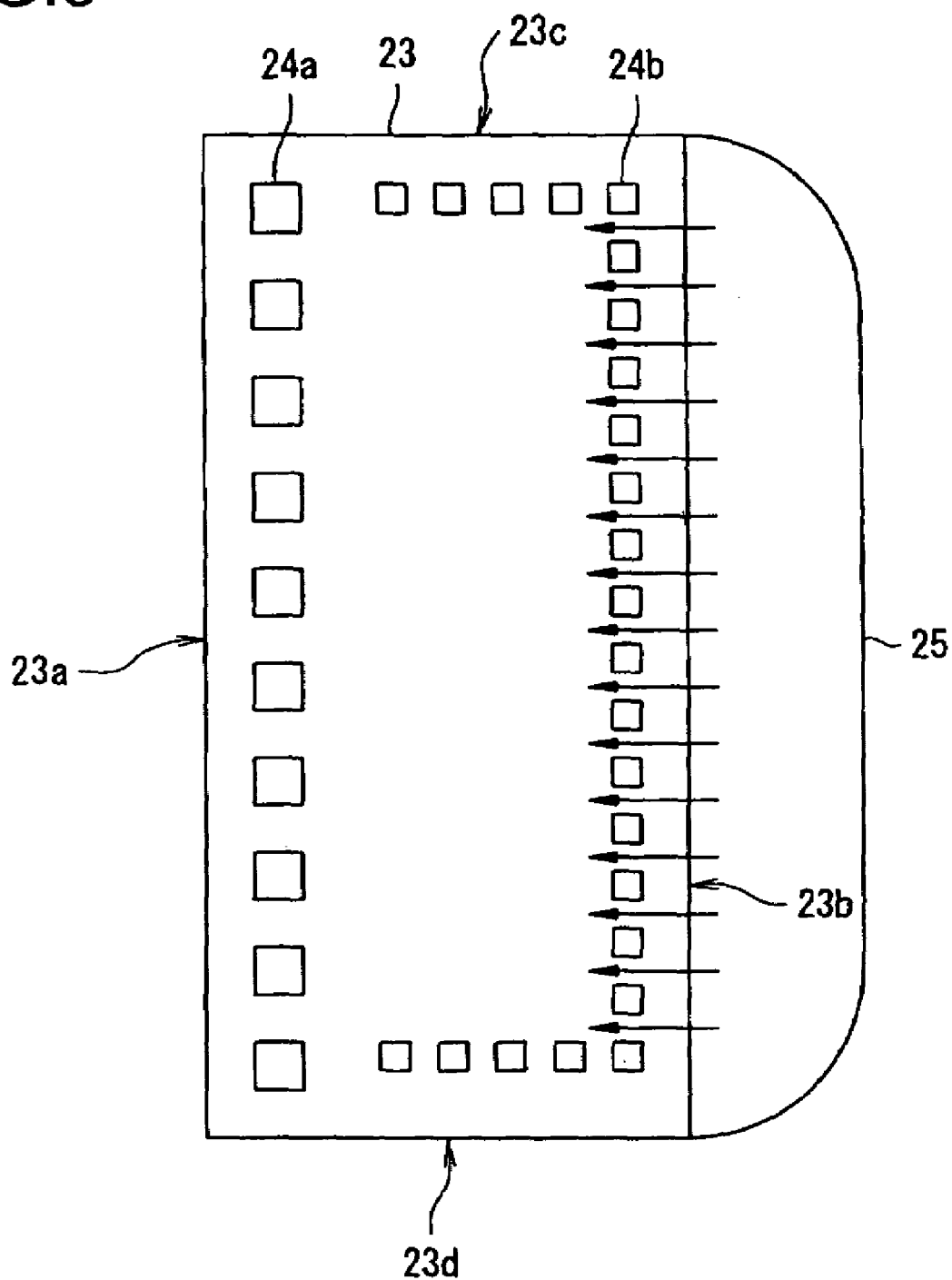
FIG. 3 is a plan view showing a method for manufacturing the semiconductor device of a third embodiment of the invention.

FIG. 3 is a plan view showing a flow of a sealing resin 25 on the semiconductor chip 23 of a third embodiment of the invention.

In FIG. 3, bump electrodes 24a and 24b are disposed on the semiconductor chip 23. Here, the bump electrodes 24a are arrayed in a straight line along one long side 23a of the semiconductor chip 23 and the bump electrodes 24b are arrayed in a straight line along the other long side 23b and each short side 23c and 23d of the semiconductor chip 23. A spacing between the bump electrodes 24b in the array is narrower than that of the bump electrodes 24a. Here, it is possible to carry out the injection of the sealing resin 25 from the long side 23b along which the bump electrodes 24b are arrayed to seal the surface of the semiconductor chip 23 that is subjected to face-down mounting via the bump electrodes 24a and 24b.

Accordingly, it is possible to increase an injection pressure of the sealing resin 25 at the array side of the bump electrodes 24b having a more narrow spacing than that of the bump electrodes 24a by changing an injecting direction of the sealing resin 25 while enabling a flowing channel of the sealing resin 25 to be shortened. As a result, it is possible to suppress the occurrence of a void in the sealing resin 25 and also to improve the sealing performance of the semiconductor chip 23 that is subjected to face-down mounting without increasing complex and laborious handling in manufacturing processes.

Figure 4A:
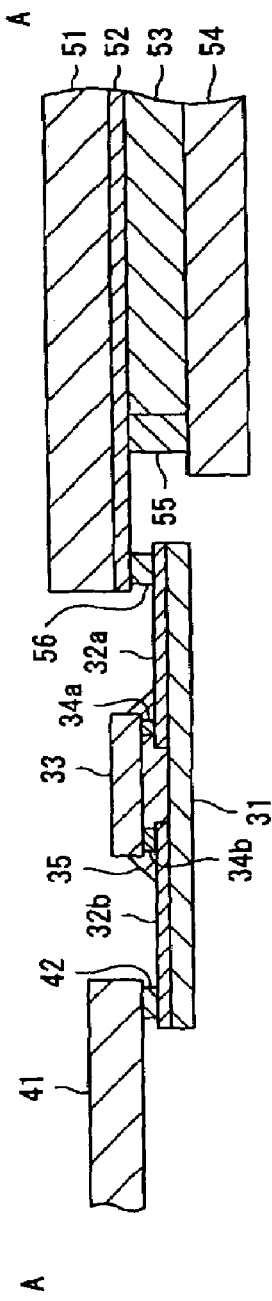
FIGS. 4(a) and (b) are diagrams showing a construction of a liquid crystal module of a fourth embodiment of the invention.
Figure 4B:
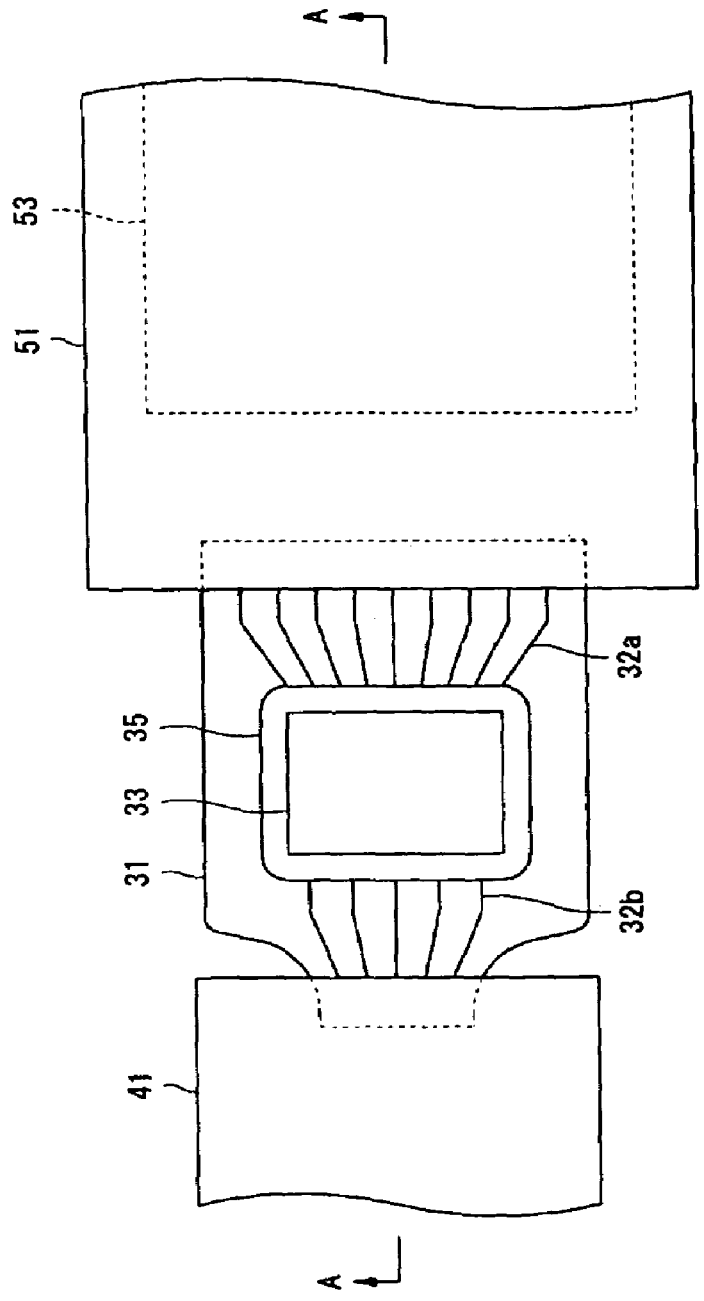

FIG. 4(a) is a cross-sectional view taken along line A—A of FIG. 4(b). FIG. 4(b) is a plan view showing a general structure of a liquid crystal module of a fourth embodiment of the invention.

In FIG. 4, the liquid crystal module includes a liquid crystal panel PN and a liquid crystal driver DR to drive the liquid crystal panel PN. The semiconductor chip 33 in which driving circuits and so forth are formed is built in the liquid crystal driver DR. The semiconductor chip 33 is mounted on a film substrate 31 via bump electrodes 34 and its surface is sealed with a sealing resin 35.

The liquid crystal panel PN includes glass substrates 51 and 54. A transparent electrode 52 such as ITO (Indium Tin Oxide) is formed on the glass substrate 51. A liquid crystal layer 53 is placed between the glass substrate 51 on which the transparent electrode 52 is formed and the glass substrate 54 and is sealed with a sealing member 55.

A wiring portion for signal input 32b and a wiring portion for signal output 32a are disposed on the film substrate 31. An outer lead of the wiring portion for signal input 32b is connected to a printed wiring board 41 with a connecting terminal 42 such as an ACF (Anisotropic Conductive Film). An outer lead of the wiring portion for signal output 32a is connected to the transparent electrode 52 with a connecting terminal 56 such as the ACF.

Each inner lead of the wiring portion for signal input 32b and the wiring portion for signal output 32a is connected to the bump electrodes 34 of the semiconductor chip 33 respectively. Here, it is possible to carry out an injection of the sealing resin 35 from the array side of the bump electrodes 34a that are connected to the wiring portion for signal output 32a to seal a surface of the semiconductor chip 33 with the sealing resin 35.

Accordingly, even if the number of wirings of the wiring portion for signal output 32a is larger than that of the wiring portion for signal input 32b, this makes it possible to suppress the occurrence of a void in the sealing resin injected into the interstices between the semiconductor chip 33 and the film substrate 31 by changing an injecting direction of the sealing resin 35. As a result, it is possible to improve a sealing performance of the semiconductor chip 33 that is subjected to face-down mounting without increasing complex and laborious handling in manufacturing processes.

What is claimed is:

1. A method of manufacturing a device, comprising:
providing an electric component including a plurality of bump electrode arrays, said bump electrode arrays being disposed along each edge of said electric component, at least one edge of said electric component including a bump electrode array formed in a zigzag arrangement, each of the bump electrodes of the zigzag arrangement having a pitch that is more narrow than a pitch of the other bump electrodes of the bump electrode arrays provided along the other edges of said electric component;
face-down mounting the electric component on a wiring board; and
carrying out resin injection from the edge of the component on which the bump electrode arrays including the more narrow pitch is disposed,
wherein the bump electrodes of the bump electrode array including the more narrow pitch have a smaller surface area than the bump electrodes of the bump electrode arrays disposed on the other edges of the electric component.

2. The method of claim 1 wherein the electric component further comprises a semiconductor chip.

* * * * *